United States Patent [19]

Gazsi

[11] Patent Number: 4,825,396
[45] Date of Patent: Apr. 25, 1989

[54] DIGITAL CIRCUIT FOR SAMPLING RATE VARIATION AND SIGNAL FILTERING AND METHOD FOR CONSTRUCTING THE CIRCUIT

[75] Inventor: Lajos Gazsi, Düsseldorf, Fed. Rep. of Germany

[73] Assignee: Siemens Aktiengesellschaft, Berlin and Munich, Fed. Rep. of Germany

[21] Appl. No.: 14,258

[22] Filed: Feb. 12, 1987

[30] Foreign Application Priority Data

Feb. 14, 1986 [DE] Fed. Rep. of Germany ....... 3604602

[51] Int. Cl.$^4$ ............................................. G06F 15/31
[52] U.S. Cl. ................................................. 364/724.15
[58] Field of Search ........................................ 364/724

[56] References Cited

FOREIGN PATENT DOCUMENTS 0123278 of 0000 European Pat. Off. .

OTHER PUBLICATIONS

Gazsi, "*Hardware Implementation of Wave Digital Filters Using Programmable Digital Signal Processors*", Conference: Circuit Theory and Design Proceedings of the 1981 European Conference on Circuit and Design, The Hague, Netherlands, Aug. 25-28, 1981, pp. 1052-1057.
Reprint from IEEE Transactions on Circuit Theory, vol. CT-18, No. 3, May, 1971, pp. 403-405: "A Solution to the Balancing Problem in N-Path Filters" by Fettweis et al.
Special Reprint from Archiv Für Elektronik und Übertragungstechnik, Electronics and Communication, vol. 30 (1976), pp. 387-393: "Optimization of Wave Digital Filters with Reduced number of Multipliers" by Owenier.
Fettweis et al, IEEE Transactions on Circuits and Systems, vol. CAS-29, No. 12, Dec. 1982, pp. 797-806, "*Sampling Rate Increase and Decrease in Wave Digital Filters*".
Fettweis, IEEE Transactions on Communications, vol. COM-30, No. 7, Jul. 1982, title "Transmultiplexers with Either Analog Conversion Circuit, Wave Digital Filters, or SC Filters-A Review".
Gazsi et al, Proc. IEEE Mediterranean Electrotechnical Conference, Athens, Greece, May 24-26, 1983, title "*Discrete Optimization of Coefficients in CSD Code*".
Philips J. Res., vol. 33, 78-102, 1978, pp. 78-102, by Claasen et al, title "*On the Transposition of Liner Time-Varying Discrete-Time Networks and Its Application to Multirate Digital Systems.*"

Primary Examiner—Gary V. Harkcom
Assistant Examiner—Tan V. Mai
Attorney, Agent, or Firm—Herbert L. Lerner; Laurence A. Greenberg

[57] ABSTRACT

A digital circuit for sampling rate variation and signal filtering includes an input, an output, a lattice wave digital filter having a plurality of filter branches connected to the input, the filter branches each having at least two series-connected filter subgroups with basic filter elements each formed of one two port adaptor made up of adders and multipliers and one time-lag device, a device disposed between the at least two filter subgroups for varying the sampling rate and for generating a phase change in a digital system, and an adder connected between filter branches and the output. A method for constructing the circuit is also provided.

12 Claims, 7 Drawing Sheets

PRIOR ART

PRIOR ART

FIG.5b $1 > \gamma > 1/2$
$\alpha = 1 - \gamma$

FIG.5c

FIG.5d $1/2 \geq \gamma > 0$
$\alpha = \gamma$

FIG.5e $\gamma = 0$

FIG.5f          FIG.5g $-1/2 \leq \gamma < 0$
$\alpha = |\gamma|$ $-1 < \gamma < -1/2$
$\alpha = 1 + \gamma$

FIG 6b $\alpha_0 = (1 - \frac{1}{8})\frac{1}{8}$ $\alpha_1 = \frac{1}{4}$ $\alpha_3 = (1 - \frac{1}{64})\frac{1}{2}$ $\alpha_5 = (1 - \frac{1}{8})\frac{1}{4}$ $\alpha_6 = \frac{1}{8}$

FIG 8a $\gamma_0 = -0.671875$
$\gamma_1 = -0.125$
$\gamma_2 = -0.40625$
$\gamma_3 = +0.8671875$

FIG 8b

DIGITAL CIRCUIT FOR SAMPLING RATE VARIATION AND SIGNAL FILTERING AND METHOD FOR CONSTRUCTING THE CIRCUIT

BACKGROUND OF THE INVENTION

1. Field of the Invention

The invention relates to a digital circuit for sampling rate variation and for signal filtering, including an input, an output, means for varying the sampling rate and for generating a phase change in a digital system, and a lattice wave digital filter having a plurality of filter branches, especially two, which are connected to the input and are connected through an adder to the output, the filter branches having filter subgroups with basic filter elements each formed of one two port adaptor made up of adders and multipliers and one time-lag device.

2. Description of the Related Art

Digital systems often operate at different sampling rates, in order to reduce the number of operations to be performed per second. Sampling rate variations, that is sampling rate increases or decreases, are necessary in order to connect parts of the system operating at different sampling rates. Each variation in the sampling rate can be broken down into two steps, namely a compression or expansion of the sampling rate and decimizing or interpolating digital filtering, which approximates an ideal low-pass or bandpass damping characteristic.

In larger and in particular in multi-rate digital systems, damping specifications are often facilitated by means of preceding filtering steps. Correspondingly, the sampling rate compressor or expander can be combined with a digital filter, which has different damping specifications from purely decimizing or interpolating digital filters. In any case, the problem is to find effective possibilities for combining the two steps. In so doing, it is always desirable for the digital filter to be driven at the lowest possible sampling rates, in order to keep the expenditure for circuitry, components and programs as low as possible.

In the class of recursive digital filters, an article by A. Fettweis and J.A. Nossek entitled "Sampling rate increase and decrease in wave digital filters", in IEEE Trans. Circuits Syst., Vol. CAS-209, No. 12, 1982, pp. 797–806, describes the use of a wave digital filter having a ladder structure in combination with a variation of the sampling rate. Wave digital filters correspond to LC and microwave filters in analog filters and have the same stability. They also have very good sensitivity, or high tolerance. The apparatus described above has some advantages, in particular those of a low power loss for a given filter structure, a wide dynamic range and a low bandpass sensitivity for the filter coefficients. However, the entire filter always operates at the higher sampling rate.

It is known from an article by A. Fettweis entitled "Transmultiplexers with either analog conversion circuits, wave digital filters or sc filters - A review". in IEEE Trans. Communications, Vol. COM-30, No. 7, 1982, pp. 1575–1586, that wave digital filters having a grid or lattice form and bireciprocal characteristic function can operate at half the otherwise required sampling rate. It is also known from this source to link pseudo-multiple-path digital filters, base digital filters and means for varying the sampling rate to one another. In order to permit an understanding of the present invention, the concept on which the bireciprocal digital filters are based will be briefly explained below with the aid of FIGS. 1 and 2, in terms of the known filter structure, beginning with the principles of its construction.

SUMMARY OF THE INVENTION

It is accordingly an object of the invention to provide a digital circuit for sampling rate variations and signal filtering and a method for the construction thereof, which overcomes the herinafore-mentioned disadvantages of the heretofore-known devices and methods of this general type, in which at least parts of the digital filter can be operated at a lower sampling rate, without resulting in characteristic limitations for the damping behavior, yet in which the superior properties of lattice wave digital filters in terms of stability and sensitivity, are retained.

With the foregoing and other objects in view there is provided, in accordance with the invention, a digital circuit for sampling rate variation and signal filtering, comprising an input, an output, a lattice wave digital filter having a plurality and preferably two filter branches connected to the input, the filter branches each having at least two series-connected filter subgroups with basic filter elements each formed of one two port adaptor made up of adders and multipliers and one time-lag device, means disposed between the at least two filter subgroups for varying the sampling rate and for generating a phase change in a digital system, and an adder connected between the filter branches and the output.

In accordance with another feature of the invention, the means for varying the sampling rate selectively increase and decrease the sampling rate by an integral factor.

In accordance with a further feature of the invention, the two port adaptors include ports having poles, and a plurality of the basic filter elements in one of the filter subgroups are cascaded in such a manner that one pole of at least one of the ports of each of the two port adaptors is directly connected to the poles of a port of another of the two port adaptors and another pole is connected through one of the time-lag devices to the poles of the port of the other of the two port adaptors.

In accordance with an added feature of the invention, the filter subgroups include a basic filter subgroup formed of one two port adaptor having two ports with poles and one time-lag device disposed between the pole of one of the ports.

In accordance with an additional feature of the invention, at least one of the two port adaptors have multipliers with a multiplication coefficient equal to zero, providing a through connection In accordance with yet another feature of the invention, a plurality of the filter subgroups are basic filter subgroups in the form of pseudo-multiple-path filter subgroups having pseudo-multiple-path filter degrees equal to the integral factors of the sampling rate variation.

In accordance with yet a further feature of the invention, the input and the output define a signal path therebetween, and the basic filter subgroups of the corresponding pseudo-multiple-path filter subgroups are disposed in the signal path downstream of the input for a sampling rate increase and upstream of the adder for a sampling rate decrease.

In accordance with yet an added feature of the invention, the input and the output define a signal path therebetween, and the means for varying the sampling rate and for generating a phase change are diposed in the signal path directly downstream of the basic filter subgroups of the corresponding pseudo-multiple-path filter subgroups for a sampling rate increase and directly upstream of the corresponding pseudo-multiple-path filter subgroups for a sampling rate decrease and are each operated at a lower sampling rate.

In accordance with yet an additional feature of the invention, the means for varying the sampling rate and for generating a phase change provide both a sampling rate increase and a sampling rate decrease.

With the objects of the invention in view there is also provided a method for constructing a digital circuit for sampling rate variation and signal filtering, which comprises initially constructing a wave digital filter having filter branches and a filter degree higher than the minimum requested degree and having a structure of a lattice wave digital filter, forming a signal path between an input and an output, connecting the filter branches to the input. connecting an adder between the filter branches and the output, selectively connecting means for varying the sampling rate and for generating a phase change in the signal path upstream of the wave digital filter for a sampling rate increase and downstream of the wave digital filter for a sampling rate decrease, connecting filter subgroups in series in the filter branches, the filter subgroups having pseudo-multiple-path filter subgroups with a number of basic filter elements equal to an integral factor of the sampling rate variation, each basic filter element being formed of one two port adaptor made up of adders and multipliers and one time-lag device, setting all but one of the multiplication coefficients of the basic filter elements of the psuedo-multiple-path filter subgroups to zero with an optimizing method, and connecting the pseudo-multiple-path filter subgroups in the signal path directly downstream of the means for increasing the sampling rate and for generating a phase change and downstream of the input for a sampling rate increase, and directly upstream of the adder for a sampling rate decrease, and forming the pseudo-multiple-path filter subgroups of the basic filter subgroups thereof.

In accordance with a concomitant mode of the invention, there is provided a method which comprises forming the wave digital filter to which the optimizing method is applied with fewer than six multiplication coefficients of the basic filter elements that differ from zero.

Other features which are considered as characteristic for the invention are set forth in the appended claims.

Although the invention is illustrated and described herein as embodied in a digital circuit for sampling rate variation and signal filtering and method a for constructing the circuit, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

BRIEF DESCRIPTION OF THE DRAWING

FIG. 3b is a block circuit diagram of a circuit according to the invention resulting from the method according to the invention and from the structure shown in FIG. 3a;

FIG. 4a is a block circuit diagram of an embodiment of a wave digital filter having a lattice structure or form and quasi-bireciprocal characteristic function and a phase factor, in combination with means for increasing the sampling rate by the factor 2;

FIG. 4b is a block circuit diagram of a circuit according to the invention resulting from the method according to the invention and from the structure shown in FIG. 4a;

FIG. 6c is a diagram of a damping behavior plotted as a function of frequency, for an optimized PCM filter as shown in FIG. 6b;

FIG. 7a is a block circuit diagram of an embodiment of a wave digital filter having a grid structure or form and quasi-bireciprocal characteristic function, in combination with means for increasing and decreasing the sampling rate, in an embodiment not having a phase factor;

FIG. 7b is a block circuit diagram of a circuit according to the invention constructed in accordance with the method according to the invention and a structure shown in FIG. 7a;

FIG. 8b is a diagram of a damping behavior plotted as a function of frequency, for a PCMN filter as shown in FIG. 8a.

DESCRIPTION OF THE PREFERRED EMBODIMENTS

Referring now to the figures of the drawings in detail, it is assumed, for example, that the sampling rate variation is to take the form of increasing the sampling rate by a factor N. Scanning values having the value zero are then inserted between each sampling value pair in an input train of sampling values, preferably at equidistant intervals N-1, so that the resultant output train comprises the sampling values of the input train and the inserted zero sampling values. N different output trains are possible, which result from delaying one version of the output train by one sampling instant at a time.

Figure 1A:
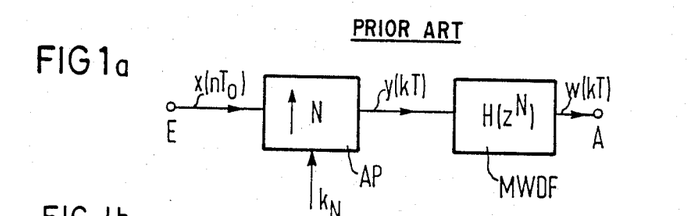
FIGS. 1a and 1b are block circuit diagrams of a circuit for sampling rate variation and generating a phase change or delay time.
Figure 1B:
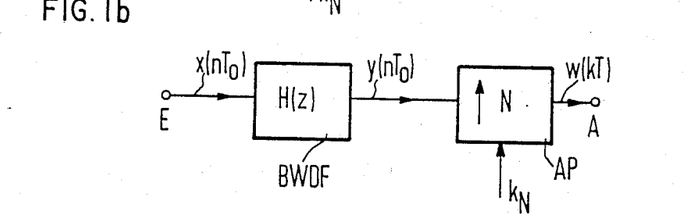

In the block circuit diagram of FIG. 1, the means for sampling rate variation and for generating a phase change or a delay time ae symbolized by a block AP, in which an upwardly pointing arrow having the reference symbol N indicates a sampling rate increase by the factor N and a downwardly pointing arrow $k_N$ in the block AP indicates the delay of the output train by $k_N$ sampling instants. The block AP can also be considered as a combination of means for sampling rate variation by the factor N, without any phase effect and a number of $k_N$ time-lag devices following it and connected in series, for the higher sampling rate.

In FIG. 1a, the input sampling train present at an input E is represented as $x(nT_o)$ and the sampling train present at the output of the block AP which has a higher sampling rate, is represented as $y(kT)$. Typically, the time-dependent variables are subjected to a time/frequency transformation, which in digital systems is known as a z-transformation. The values $X(z)$ and $Y(z)$ are the z-transformed values of $x(nT)$ and $y(kT)$, and z is defined as $z = e^{pT}$ having the complex constant p. In FIG. 1a, for the z-transformed variable $Y(z)$ at the output of block AP, the following relationship applies, according to equation 1:

$$Y(z) = z^{-kN} \cdot X(z^N). \qquad (1)$$

The first factor in equation 1 indicates a time lag or a phase change and the second factor of equation 1 indicates the z-transformation rate of the input sampling function $x(nT_o)$ that is applicable for the higher sampling rate.

According to FIG. 1a, the sampling train $y(kT)$, with the sampling rate increased by the factor N, or the z-transformed $Y(z)$, then reaches a pseudo-multiple-path digital filter MWDF, which has the transfer function $H(z^N)$. The filtered sampling train $w(kT)$ having the higher sampling rate is present at an output A of the circuit of FIG. 1a. In the illustrated embodiment, the pseudo-multiple-path filter MWDF is a psuedo-N-path digital filter. Such filters are known, for example from an article by A. Fettweis and H. Wupper entitled "A solution to the balancing problem in N-path filters" in IEEE Trans. Circuit Theory, Vol. CT-18, 1971, pp. 403–405. The base digital filter belonging to the pseudo-N-path filter is obtained by replacing the shift register of the pseudo-N-path digital filter having N steps, with time-lag devices. This means that in the transfer function $H(z^N)$ of the pseudo-N-path digital filter, the argument $z^N$ must be replaced by the argument z, so that for the base digital filter the transfer function $H(z)$ is obtained.

With equation 1, it follows directly that the pseudo-N-path digital filter having the transfer function $H(z^N)$ can form its base digital filter having the transfer function $H(z)$, whenever the order of the scanning rate increase and the digital filtering is reversed. These equivalent embodiments are shown in FIG. 1, and in FIG. 1a the input sampling train is first subjected to a sampling rate increase and is then filtered through a pseudo-multiple-path digital filter MWDF. On the other hand, in FIG. 1b the input sampling train is first filtered in the base digital filter MWDF and then is subjected to a sampling rate increase. Elements identical to those of FIG. 1a have the same reference numerals.

Figure 2A:
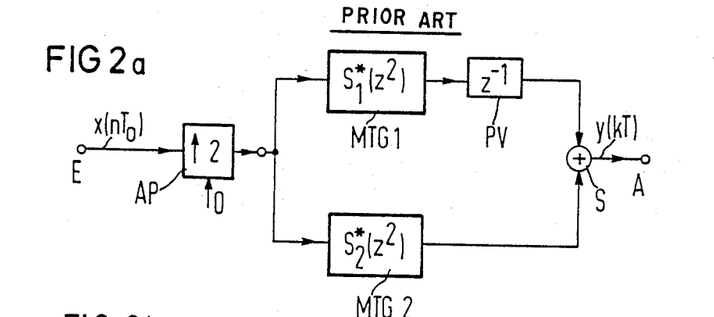
FIGS. 2a and 2b are block circuit diagrams of a circuit for sampling rate variation and signal filtering.
Figure 2B:
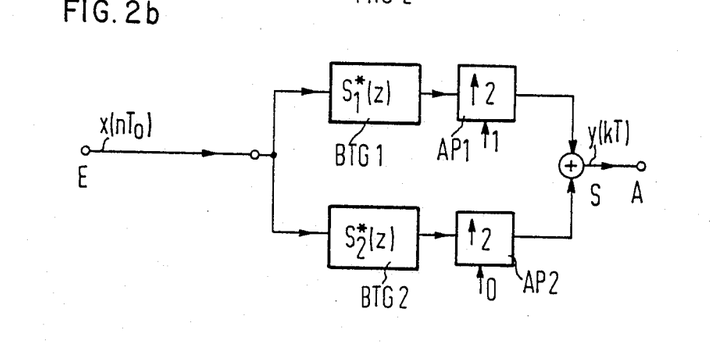

FIG. 2 shows an embodiment according to the prior art of a digital circuit for sampling rate variation and signal filtering and of a method for constructing the circuit. The sampling rate variation is to be carried out at a factor of 2 and the digital filter is a wave digital filter having a grid form or lattice structure and a bireciprocal characteristic function. If the transmission behavior of the two filter branches of the filter is described by reflectances $S_1$ and $S_2$, then the transfer variables of the filter branches in the prior art circuit having a bireciprocal characteristic function can be written in the following form, according to equation 2:

$$S_1 = S_1^*(z^2) \cdot z^{-1} \qquad (2a)$$

$$S_2 = S_2^*(z^2). \qquad (2b)$$

One circuit is shown in FIG. 2a. The means AP for sampling rate variation by the factor of 2 without generating a phase change is disposed in the signal path following the input terminal E and the output of the means AP leads to two branches of the wave digital filter. The upper branch of the wave digital filter is characterized by the reflectance $S_1$, that is a pseudo-multiple-path filter subgroup MTG 1 and a following phase delay device PV, and the lower branch of the wave digital filter is characterized by the reflectance $S_2$, that is a pseudo-multiple-path filter subgroup MTG 2, and the outputs of both filter branches lead to an adder S, which is connected to the output A of the circuit. The pseudo-multiple-path filter subgroups MTG 1 and MTG 2 have transfer functions $S_1^*(z^2)$ and $S_2^*(z^2)$, respectively. Since both transfer functions are dependent on $z^2$, the equivalence explained with reference to FIG. 1 can be applied in this case.

FIG. 2b shows a circuit resulting from FIG. 2a for a wave digital filter having a lattice structure or form, a bireciprocal characteristic function and a sampling rate increase, taking the discussion of FIG. 1 into account. As compared with FIG. 2a, the pseudo-multiple-path filter subgroups MTG 1 and MTG 2 are provided in the form of base filter subgroups BTG 1 and BTG 2 thereof, with transfer functions $S_1^*(z)$ and $S_2^*(z)$. Both filter subgroups are directly connected to the input side to the input E of the circuit and operate at a low sampling rate. On the output side of the filter subgroups BTG 1 and BTG 2, the sampling rates are increased with the aid of means AP 1 and AP 2 for varying the sampling rate by a factor of 2 and for generating a phase change. The block AP 1 at the same time generates the phase change or the phase delay by a sampling rate that is provided in accordance with FIG. 2a by the phase delay PV having the transfer function $z^{-1}$. As in FIG. 2a, the outputs of the filter branches in FIG. 2b are fed to the adder S, which is connected to the output A of the circuit.

The two means AP 1 and AP 2 for sampling rate variation and for generating a phase delay according to FIG. 2b, each insert a zero value between two sampling values having a different order, that is one having a phase factor 1 and the other having a phase factor 0. The output train $y(kT)$ can therefore be obtained in a simple manner by switching back and forth between the two filter branches, so that in this embodiment the adder S can be dispensed with.

According to FIG. 2b, the entire digital filter operates at a lower sampling rate. However, one disadvantage of this circuit arises due to the fact that the characteristic function must be bireciprocal. For real frequencies, the damping always amounts to 3.01 dB, at onefourth of the sampling frequency. Furthermore, the damping behavior cannot be freely predetermined as a function of the frequency, because one-half of the filter behavior is already determined by the Nyquist interval and the other half is obtained with the aid of the Feldtkeller equation. For many applications, these properties of symmetry on the part of the bireciprocal characteristic function are undesirable.

The invention assumes that the transmittances characterizing the transmission behavior of the digital filter, that is in the embodiment the reflectances $S_1$ and $S_2$, can be broken down into products having factors which depend on one hand on $z^N$ and on the other hand on z alone. In addition, factors may also be present which describe a phase effect, that is a phase delay. The product terms which depend on $z^N$ and have a transfer function which therefore describes a pseudo-N-path digital filter, can then be represented by a base wave digital subfilter, which is operated at a lower sampling rate, in a manner equivalent to the conventional principle illustrated in FIG. 1. In accordance with the invention, the circuit for sampling rate variation and for signal filtering has means disposed between at least two filter subgroups for varying the sampling rate and for generating a phase change, the transfer functions of which correspond to the factors of the product of the transmittances, with the pseudo-multiple-path digital filter subgroups being constructed as their base filter subgroups in accordance with FIG. 1.

Corresponding to FIG. 2, it is assumed that a sampling rate increase by the factor 2 is to be performed without any phase effect, and that the transmittances of the lattice wave digital filter can be described by the reflectances $S_1$ and $S_2$ in an embodiment. The transmittances are first factored into products in accordance with equation 3:

$$S_1 = S_1'(z^2) \cdot S_1''(z) \tag{3a}$$

or $$S_1 = S_1'(z^2) \cdot z^{-1} \cdot S_1''(z) \tag{3b}$$

$$S_1 = S_2'(z^2) \cdot S_2''(z). \tag{3c}$$

Equation 3 expresses the fact that both transmittances $S_1$ and $S_2$ have partial parts which are even in z, that is which are dependent on $z^2$. As described in connection with FIG. 1, it is naturally possible for only these parts of the filter to operate at a lower sampling rate, if the digital wave filter is combined with the means for increasing the sampling rate by the factor 2.

Figure 3A:
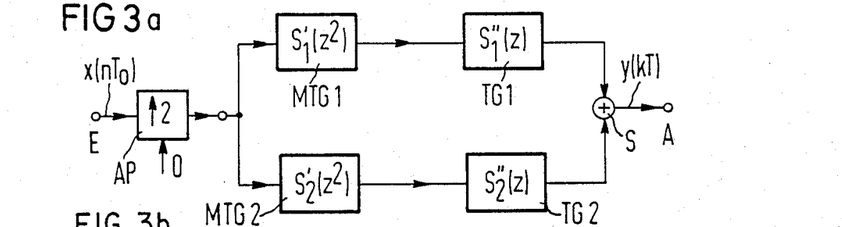
FIG. 3a is a block circuit diagram of an embodiment according to the invention for constructing a wave digital filter having a grid form or lattice structure and quasi-bireciprocal characteristic function without an additional phase factor, in combination with means for increasing the sampling rate by the factor 2.

A block circuit diagram of an embodiment according to equation 3a and equation 3c is shown in FIG. 3a. The input signal $x(nT_0)$ at the input E of the circuit first reaches the block AP, in which the sampling rate is increased by the factor 2, as the signal path continues. The ensuing wave digital filter has two signal branches, each having a transfer function according to equations 3a and 3c, respectively. To this end, the pseudo-multiple-path filter subgroups MTG 1 and the filter subgroup TG1 are disposed one after the other in the first branch and have the respective transfer functions according to the factors of the transmittance $S_1$ in accordance with equation 3a. The pseudo-multiple-path filter subgroup MTG 2 and the filter subgroup TG2 dispsoed in the second filter group, have the respective transfer functions according to the factors of the transmittance $S_2$ in accordance with equation 3c. The signals of the filter branches are added with the aid of an adder S, to make the output signal $y(kT)$, which is present at the output A of the circuit.

As explained in connection with FIG. 1, the means for varying the sampling rate can be "shifted" behind the respective first blocks of the filter blocks, if these blocks are constructed as base filter subgroups. The result is the structure according to the invention shown in FIG. 3b. The two filter branches are connected directly to the inputs E. In the first filter branch, the signal path first contains the base filter subgroup BTG 1 having the transfer function $S_1'(z)$ and then the means AP 1 for varying the sampling rate by the factor 2. In the second filter branch, the signal path contains the base filter subgroup BTG 2 having the transfer function $S_2'(z)$ and the means AP 2 for varying the sampling rate by the factor 2. The other blocks TG 1 in the first filter branch and TG 2 in the second filter branch, are disposed directly upstream of the adder S, as in FIG. 3a.

Figure 3B:
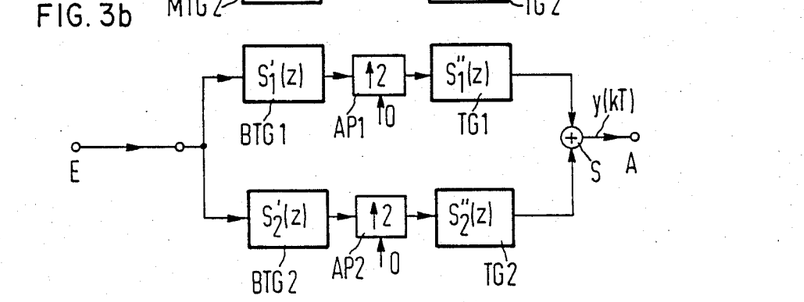
Figures 4A, 4B:
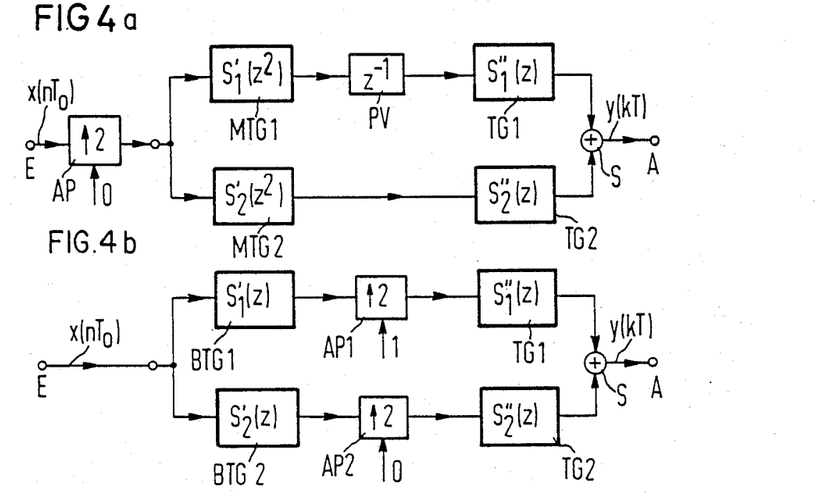

FIG. 4 shows a block circuit diagram of an embodiment in which the transfer functions $S_1$ and $S_2$ of the two filter branches are factored in accordance with equations 3b and 3c. Contrary to FIG. 3a, a time-lag device PV having a transfer function $z^{-1}$ is disposed between the two blocks MTG 1 and TG 1. The remainder of the circuit is equivalent to FIG. 3a. FIG. 4b shows the circuit according to the invention in which the means AP for varying the sampling rate and generating a phase change according to FIG. 1 are "shifted" into the digital filter, in which case the pseudo-multiple-path filter subgroups must then be in the form of base filter subgroups. As shown in FIG. 4b, the result is the same circuit as in FIG. 3b, with the difference that in the first filter branch, the means AP 1 for varying the sampling rate and generating a phase change effects a phase change by the amount of one sampling rate.

For the special case in which the transfer functions $S_1''(z)$ and $S_2''(z)$ are each equal to 1 in the filter subgroups TG 1 and TG 2 of FIG. 4, the result is the already known structure of a bireciprocal wave digital filter according to FIG. 2.

For arbitrary filter specifications, in the prior art either a wave digital filter having a high sampling frequency or two cascaded filters must be used, one of which is a bireciprocal wave digital filter and the other a correcting filter.

An advantage of the circuit according to the invention is the ability to provide arbitrary filter specifications with the aid of the quasi-bireciprocal wave digital filter and at the same time to reduce the expenditure for circuitry, that is the expenditure for addition, multiplication and memory storage as compared with the known filter or circuits. A portion of the filter operates at a lower sampling rate and another portion operates at a high sampling rate and the variation of the sampling rate is carried out in the filter branches themselves. The larger the proportions of the pseudo-multiple-path filter subgroups MTG 1 and MTG 2 become, in the factoring according to equation 3 or FIGS. 3a and 4a, or in other words the greater the approximation to a bireciprocal wave digital filter, the less expenditure has to be borne for the circuit. Another advantage of the circuit according to the invention is that the signal-to-noise voltage ratio is less than in the case of two cascaded filters.

In physical terms, the factoring of the transfer functions or transmittances in accordance with equation 3 means breaking down the characteristic function of the digital wave filter into a bireciprocal part and general part, and vice versa. This is the basis for the advantageous property of the filter of not being subjected to any limitations in terms of the specification. On the other hand, the construction of a filter having a grid form or lattice structure and transmittances taking the form represented in equation 3 cannot simply be based on the criteria for constructing a normal or bireciprocal filter. The invention therefore also encompasses a method for constructing a circuit according to the invention.

Figure 5A:
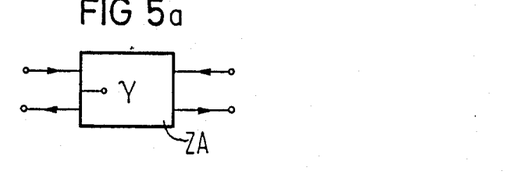
FIGS. 5a–5h are basic blockmand schematic circuit diagrams of embodiments of two port adaptors for sinusoidal excitation used in a circuit according to the invention.
Figures 5B, 5C, 5D:
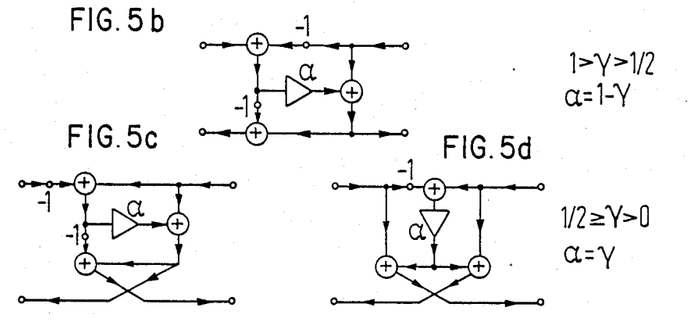
Figure 5E:
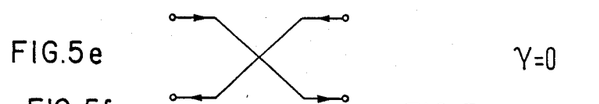
Figure 5F:
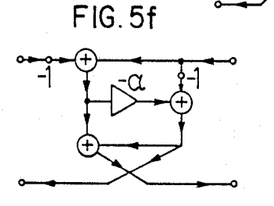
Figure 5G:
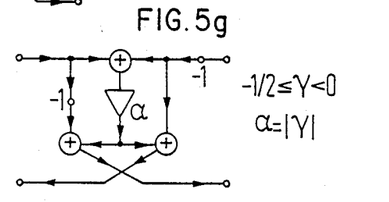
Figure 5H:
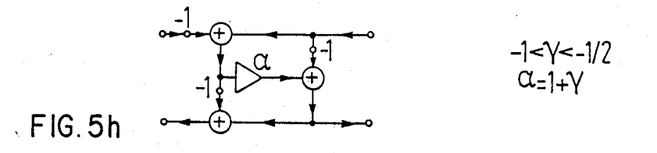

FIG. 5 shows embodiments of two port adaptors required for providing a wave digital filter. FIG. 5a shows a block circuit diagram of a two port adaptor ZA, which in addition to having two terminals for each of an input and an output port, has a further terminal for setting a coefficient $\gamma$ that substantially codetermines the transmission behavior of the two port adaptor ZA. A two port adaptor can be defined in accordance with equation 4:

$$b_1 = \gamma \cdot (a_2 - a_1) + a_2 \tag{4a}$$

$$b_1 = \gamma \cdot (a_2 - a_1) + a_1, \tag{4b}$$

where $a_1$ and $a_2$ are input variables, $b_1$ and $b_2$ are output variables and $\gamma$ is the coefficient. The drawings in FIGS. 5b–5h show various embodiments of signal flow diagrams, with which optimal results can be obtained with sinusoidal excitation for various ranges of the value of $\gamma$. According to FIG. 5e, a two port adaptor degenerates into a pure through connection if the coefficient $\gamma$ becomes zero. For a construction with programmable signal processors, it may be more advantageous to use forms of structures of two port adaptors in accordance with equation 5:

$$b_1 = \beta \cdot a_2 - \gamma \cdot a_1 \tag{5a}$$

$$b_2 = \gamma \cdot a_2 + \delta \cdot a_1, \tag{5b}$$

where $\beta = 1 + \gamma$ and $\delta = 1 - \gamma$.

A wave digital filter or digital wave filter is a combination of a plurality of filter subgroups, which in turn include a plurality of basic filter elements. A said filter element, in turn comprises a two port adaptor according to FIG. 5 and one memory element, which effects a time-lag or phase effect. The degree of the filter is determined by the number of two port adaptors and associated memory elements.

Figure 6A:
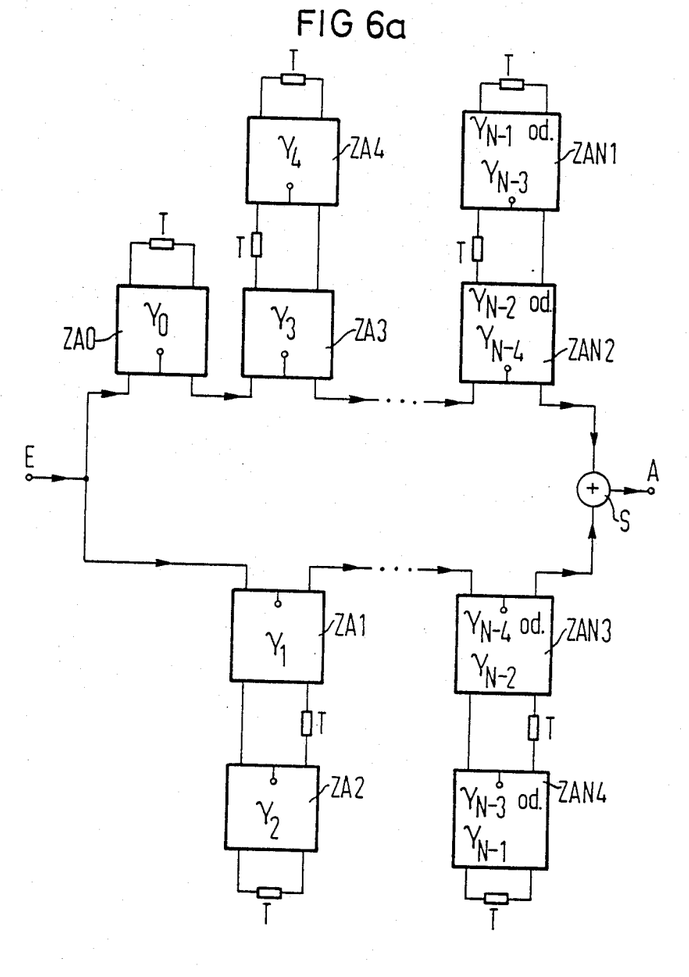
FIG. 6a is a block circuit diagram of a wave digital filter having a lattice structure or form, including the two port adaptors of FIG. 5.

In constructing a circuit according to the invention, a wave digital filter with a lattice structure is first constructed in a known manner, for example with the aid of the article by L. Gazsi entitled "Explicit formulae for lattice wave digital filters" in IEEE Trans. Circuits and Systems, Vol. CAS-32, No. 1, 1985, pp. 68–88. FIG. 6a shows a block circuit diagram of an embodiment of such a wave digital filter. In both filter branches there are a plurality of filter subgroups connected in series, which in turn comprise basic filter elements each comprising one two port adaptor ZA0–ZA4, ZAN1–ZAN4 and one associated time-lag device T. When a plurality of basic filter elements are provided in one filter subgroup, the basic elements are cascaded in such a way that one pole of at least one port of each two port adaptor ZA is connected directly, and the other pole is connected through a time-lag device T, to the poles of one port of another two port adaptor. Each filter subgroup furthermore includes at least one two port adaptor in which the time-lag device T is connected between the poles of a port.

According to FIG. 6a, except for the first filter subgroup comprising the two port adaptor ZA0 and one time-lag device T, each filter subgroup contains two two port adaptors and two time-lag devices T, because in the embodiment according to FIGS. 3 and 4 the sampling rate is supposed to be increased by the factor 2. In general, it is necessary for as many filter subgroups as possible to contain the same number of basic filter elements, with this number being equal to the factor by which the sampling rate is to be varied. Furthermore, in a construction according to FIG. 6a, in order to assure sufficient freedom of construction, the filter degree should be selected to be higher than the minimum requested filter degree. Therefore, in the next step, all but one of the coefficients $\gamma$ of the basic filter elements cascaded into a filter subgroup are selected as zero, so that a number of time-lag devices equal to the factor of the sampling rate variation are connected directly in series with one another. Such a device makes use of the fact that a two port adaptor having a coefficient $\gamma = 0$ represents a through connection.

The coefficients $\gamma_i$, (i = 0 ... N-1) are generally not equal to zero, however. For this reason, optimizing methods which are already known for constructing digital filters are used for the coefficients $\gamma_i$, and the available freedom of construction is utilized for selecting some of the coefficients to be zero. One of these methods is known, for example, from an article by K. Owenier, "Optimization of wave digital filters with a reduced number of multipliers", in Arch. Electr. ubertr., Vol. 30, 1976, pp. 387–393. The above-described method can be used without limitation for constructing a circuit according to the invention.

If the number of coefficients differing from zero is not greater than five, then a discrete optimizing method can be used, from which the final quasi-bireciprocal wave digital filter in lattice structure directly results. The discrete optimizing method is known from the publication of L. Gazsi and S. N. Güllüoglu, "Discrete optimization of coefficients in CSD code", Proc. IEEE Mediterranean Electrotechnical Conf., Athens, Greece, May 1983, pp. C03.08/9.

Figure 6B:
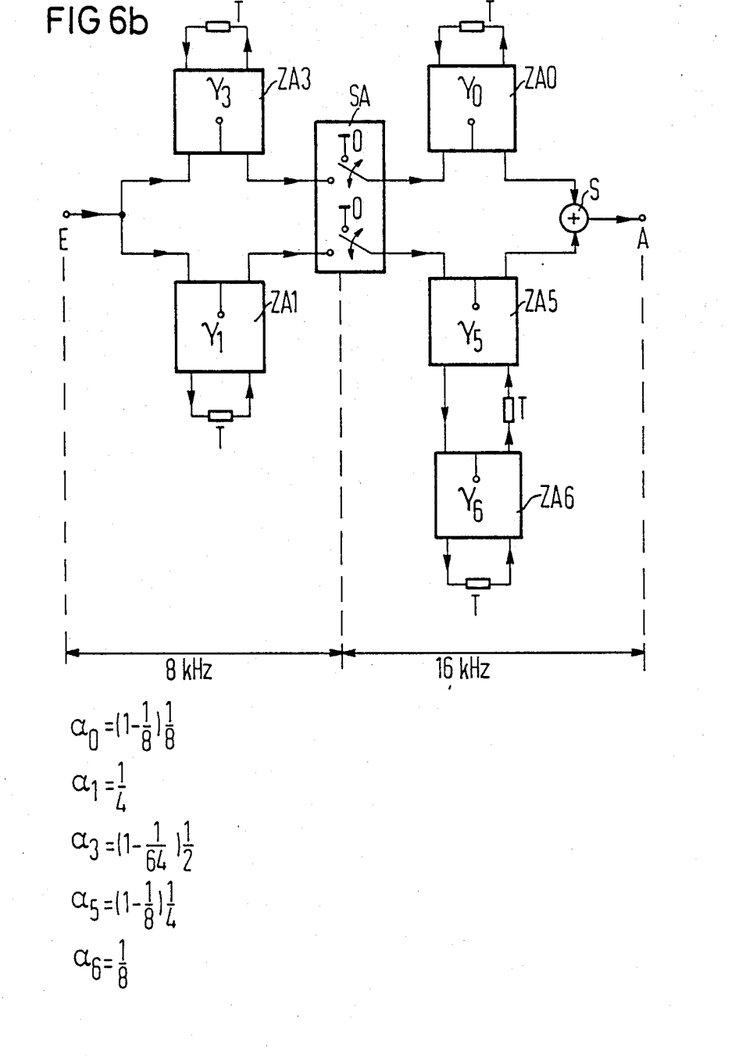
FIG. 6b is a block circuit diagram of an embodiment of a PCM filter having a circuit according to the invention as shown in FIG. 3b.
Figures 6C, 7A, 7B:
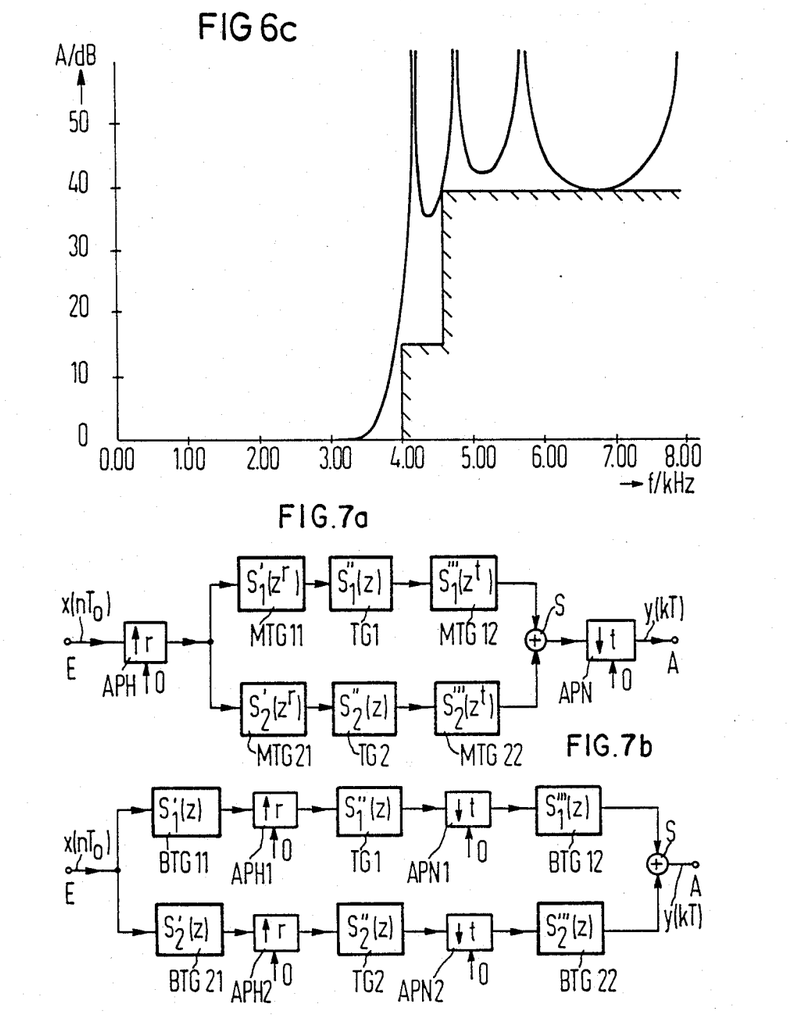

With the aid of the circuit of FIG. 6a, a circuit for a PCM system is to be constructed and described according to the embodiment of FIG. 6. PCM transmission paths operate at a sampling rate of 8 kHz. The PCM code must be processed, or processed further on the transmitting or receiving paths. For example, the PCM code is linearized and expanded on the receiving side, or in other words the sampling rate is increased. In the embodiment, the filtering and increasing of the sampling rate takes place after the linearizing of the PCM code. The damping behavior is plotted as a function of the frequency as a specification for the low-pass PCM filter operating at a sampling rate of 16 kHz. Below 3.4 kHz, the damping should be less than 0.2 dB, above 4 kHz it should be at least 15 dB, and above 4.6 kHz it should be at least 40 dB. In order to attain this, in the prior art a non-bireciprocal lattice wave digital filter according to FIG. 6a which has a filter degree of at least 5 and operates at a high sampling rate, is required.

According to the invention, in a structure according to FIG. 6a the filter degree becomes higher than the lowest possible grade, with a filter degree of 7 being selected in the embodiment; that is, seven two port adaptors and seven time-lag devices T are required. According to FIG. 6a it is possible to place three filter subgroups in the first filter branch and one filter subgroup having the two port adaptors ZA1 and ZA2 and their time-lag devices T in the second filter branch. In the embodiment, however, two filter subgroups having the two port adaptors ZA0, ZA3 and ZA4 are to be provided in the first filter branch and again two filter subgroups having the two port adaptors ZA1, ZA2, ZA5 and ZA6 are to be provided in the second filter branch. The two port adaptors ZA5 and ZA6 are obtained by renaming the two port adaptors ZAN3 and ZAN4.

Since the lowest possible filter degree is 5, when the first of the above-described optimizing methods is used, two of the coefficients are selected as zero, which are the coefficients $\gamma_2$ and $\gamma_4$ in the embodiment. The two port adaptors ZA2 and ZA4 then represent through connections, so that in the associated filter subgroups, two time-lag devices T at a time are connected directly in series with one another.

Since it is the task of the time-lag devices to delay a signal present at their input by the amount of one sampling rate, the input signals of two time-lag devices connected in series are delayed by two sampling rates, without any further operation being performed. Consequently, the two port adaptors ZA1 and ZA3 that belong to the coefficients $\gamma_1$ and $\gamma_3$ can be operated at a lower sampling rate, dispensing with one time-lag device T each.

In the circuit of FIG. 6a, the filter subgroups having the two port adaptors ZA1 and ZA3 in each filter branch are disposed directly downstream of the input terminal E, that is the filter subgroup having the two port adaptor ZA0 is disposed farther back in the signal path. The means for varying the sampling rate, which in the embodiment is in the form of a circuit SA and which inserts a zero value between two sampling rates present at the input E, can be "shifted" into the filter.

The circuit according to the invention which results with the aid of the method of construction according to the invention is shown in FIG. 6b. The sampling rate in each filter branch is increased by the factor 2 with the aid of the circuit SA, so that the first portion of the filter having the two port adaptors ZA1 and ZA3 and their time-lag devices T operates at a lower sampling rate of 8 kHz, and the second portion of the filter operates at the high sampling rate of 16 kHz. Additionally, FIG. 6b shows the optimized coefficients, which are related to the coefficients of the two port adaptors, as shown in FIG. 5.

It is within the scope of the invention to also perform simplifications in the second portion of the filter operating at the higher sampling rate. In other words, under some conditions individual elements can be operated at a lower sampling rate and consequently can be disposed upstream of the input of the circuit SA. In the embodiment, these provisions apply, for example, to the input adder or input subtracter of the two port adaptors ZA0 and ZA5, because in accordance with FIG. 6b the switches of the circuit SA feed zero values into the two two port adaptors every other scanning instant.

FIG. 6c shows the damping behavior as a function of the frequency for the circuit according to the invention, which is optimized according to the invention. While below 3.4 kHz the damping is less than 0.2 dB, at kHz the damping is markedly greater than the prescribed 15 dB.

The same construction criteria according to the invention can also be used for a circuit for decreasing the sampling rate, if one used only the modifications described in the article by T. A. C. M. Claasen and W. F. G. Mecklenbräuker, "On the transposition of linear time-varying discrete-time networks and its application to multirate digital systems" in Philips I. Res., Vol. 33, 1978, pp. 78–102. According to the invention, the result is block circuit diagrams as shown in FIG. 3b and FIG. 4b, except that in each filter branch the blocks having the basic filter subgroups BTG and the filter subgroups TG change places and the means AP for varying the sampling rate effect a decrease of the sampling rate. In this kind of circuit for decreasing the sampling rate, the filter subgroups operating at a lower sampling rate are thus disposed before the adder S of the circuit.

With the aid of the method of construction according to the invention, it is likewise possible to construct a circuit in which a wave digital filter is combined with means for increasing and decreasing the sampling rate, known as multirate sampling systems. FIG. 7a shows a block circuit diagram of an embodiment in which the signal path following the input E of the circuit contains means APH for increasing the sampling rate by a factor r, then a wave digital filter in lattice structure or grid form with two filter branches having outputs which lead to an adder S, and means APN disposed between the output of the adder S and the output terminal A for decreasing the sampling rate by a factor t. The sampling rate is thus varied between the input terminal E and the output terminal A of the circuit, by a fraction r divided by t, where r and t are integers.

In accordance with the invention, the transfer functions, that is the transmittances $S_1$ and $S_2$ of the filter branches, are then factored again, so that pseudo-r-path and pseudo-t-path filter subgroups, as well as filter subgroups, are provided. According to the invention, the pseudo-r-path filter subgroups MTG11 and MTG21 are then provided as basic filter subgroups BTG11 and BTG21, and the pseudo-t-path filter subgroups MTG12 and MTG22 are provided as basic filter subgroups BTG12 and BTG22, using one of the above-described optimizing methods. At the same time, the means APH for increasing the sampling rate and the means APN for decreasing the sampling rate are "shifted" from the input terminal E of the output terminal A through the basic filter subgroups into the filter.

The resultant circuit according to the invention is shown in FIG. 7b. In the signal path, the first branch of the circuit contains the blocks BTG11, APH1, TG1, APN1 and BTG12; the second branch of the circuit contains the blocks BTG21, APH2, TG2, APN2 and BTG22. According to the invention, the first part of the circuit operates at the lower sampling rate arriving at the input terminal E, while the second part, that is the filter subgroups TG1 and TG2, operates at the sampling rate increased by the factor r and the third part, that is the basic filter subgroups BTG12 and BTG22 and the adder S, operates at the sampling rate decreased by the factor t.

The method for constructing the circuitry according to the invention is applicable to these multi-rate sampling systems in just the same manner as in the case of systems in which the sampling rate is varied by only a single factor.

Figure 8A:
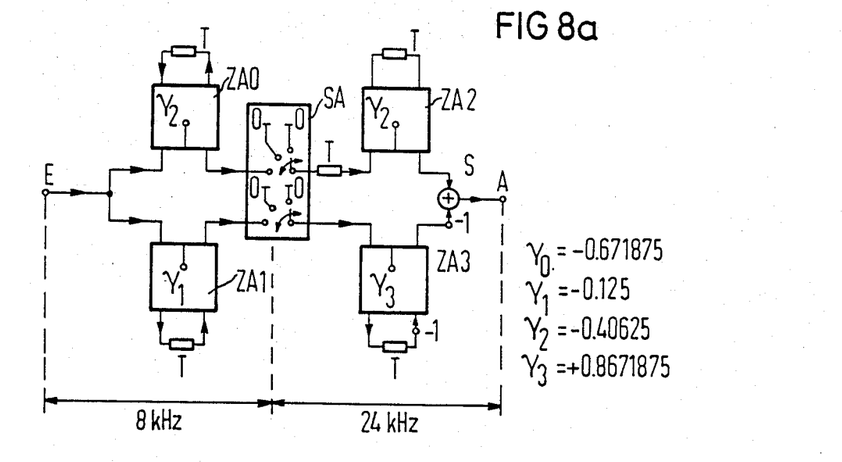
FIG. 8a is a block circuit diagram of an embodiment of an optimized multiple-rate PCM wave digital filter having an increase of the sampling rate by the factor 3.
Figure 8B:
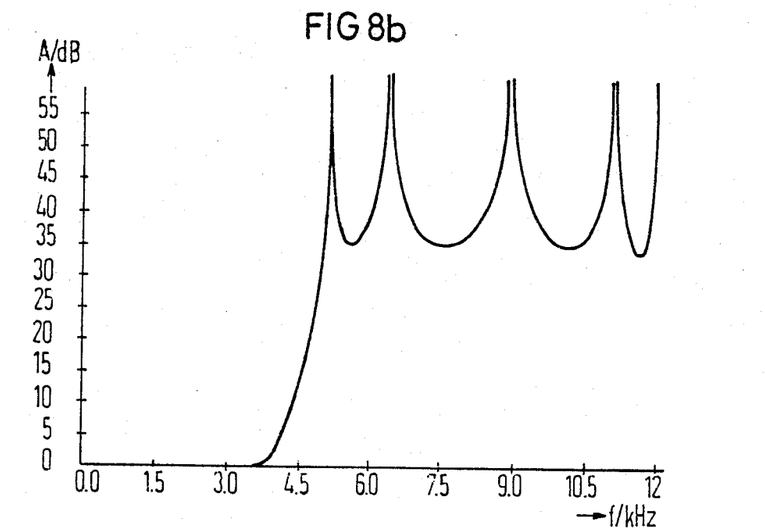

FIG. 8 therefore shows an embodiment of a PCM multi-rate wave digital filter according to the invention, in which the factor r is equal to 3 and the factor t is equal to 1. In other words the sampling rate is increased by the factor 3. FIG. 8a shows a block circuit diagram of the circuit, in which the filter subgroups having the two port adaptors ZA0 and ZA1 and their time-lag devices T operate at the lower sampling rate of 8 kHz and the filter subgroups having the two port adaptors ZA2 and ZA3, their time-lag devices, the adder S and a time-lag device T in the first filter branch upstream of the input of the two port adaptor ZA2 operate at a sampling rate of 24 kHz. Two switches of a circuit SA insert two zero values at a time between each two sampling values in the train present at the input E. At the same time, FIG. 8a also shows optimal values for the $\gamma$ coefficients of the two port adaptors, with which the damping behavior shown in FIG. 8b results as a function of the frequency.

The foregoing is a description corresponding in substance to German Application P No. 36 04 602.7, dated Feb. 14, 1986, the International priority of which is being claimed for the instant application, and which is hereby made part of this application. Any material discrepancies between the foregoing specification and the aforementioned corresponding German application are to be resolved in favor of the latter.

I claim:

1. A digital circuit for sampling rate variation and signal filtering, said circuit comprising an input, an output, a lattice wave digital filter having a plurality of filter branches connected to said input, said filter branches each having at least two series-connected filter subgroups with basic filter elements each formed of one two port adaptor made up of adders and multipliers and one time-lag device, means disposed between said at least two filter subgroups for varying the sampling rate and for generating a phase change in a digital system, and an adder connected between said filter branches and said output.

2. A digital circuit according to claim 1, wherein said plurality of filter branches are in the form of two filter branches.

3. A digital circuit according to claim 1, wherein said means for varying the sampling rate selectively increase and decrease the sampling rate by an integral factor.

4. A digital circuit according to claim 3, wherein a plurality of said filter subgroups are basic filter subgroups in the form of pseudo-multiple-path filter subgroups having pseudomultiple-path filter degrees equal to said integral factors of the sampling rate variation.

5. A digital circuit according to claim 4, wherein said input and said output define a signal path therebetween, and said basic filter subgroups of said corresponding pseudo-multiple-path filter subgroups are disposed in said signal path downstream of said input for a sampling rate increase and upstream of said adder for a sampling rate decrease.

6. A digital circuit according to claim 4, wherein said input and said output define a signal path therebetween, and said means for varying the sampling rate and for generating a phase change are disposed in said signal path directly downstream of said basic filter subgroups of said corresponding pseudo-multiple-path filter subgroups for a sampling rate increase and directly upstream of said corresponding pseudo-multiple-path filter subgroups for a sampling rate decrease and are each operated at a lower sampling rate.

7. A digital circuit according to claim 1, wherein said two port adaptors include ports having poles, and a plurality of said basic filter elements in one of said filter subgroups are cascaded in such a manner that one pole of at least one of said ports of each of said two port adaptors is directly connected to said poles of a port of another of said two port adaptors and another pole is connected through one of said time-lag devices to said poles of said port of said other of said two port adaptors.

8. A digital circuit according to claim 1, wherein said filter subgroups include a basic filter subgroup formed of one two port adaptor having two ports with poles and one time-lag device disposed between said poles of one of said ports.

9. A digital circuit according to claim 1, wherein at least one of said two port adaptors have multipliers with a multiplication coefficient equal to zero, providing a through connection.

10. A digital circuit according to claims 1, whrein said means for varying the sampling rate and for generating a phase change provide both a sampling rate increase and a sampling rate decrease.

11. A method for constructing a digital circuit for sampling rate variation and signal filtering, which comprises:
initially constructing a wave digital filter having filter branches and a filter degree higher than the minimum requested degree and having a structure of a lattice wave digital filter,
forming a signal path between an input and an output, connecting the filter branches to the input, connecting an adder between the filter branches and the output,
selectively connecting means for varying the sampling rate and for generating a phase change in the signal path upstream of the wave digital filter for a sampling rate increase and downstream of the wave digital filter for a sampling rate decrease,
connecting filter subgroups in series in the filter branches, the filter subgroups having pseudo-multiple-path filter subgroups with a number of basic filter elements equal to an integral factor of the sampling rate variation, each basic filter element being formed of one two port adaptor made up of adders and multipliers and one time-lag device,
setting all but one of the multiplication coefficients of the basic filter elements of the pseudo-multiple-path filter subgroups to zero with an optimizing method, and connecting the pseudo-multiple-path filter subgroups in the signal path directly downstream of the means for increasing the sampling rate and for generating a phase change and downstream of the input for a sampling rate increase, and directly upstream of the adder for a sampling rate decrease, and
forming the pseudo-multiple-path filter subgroups of the basic filter subgroups thereof.

12. A method according to claim 11, which comprises forming the wave digital filter to which the optimizing method is applied with fewer than six multiplication coefficients of the basic filter elements that differ from zero.

* * * * *